United States Patent [19]

Young

[11] Patent Number: 4,695,707
[45] Date of Patent: Sep. 22, 1987

[54] HEATING OVEN

[75] Inventor: David N. Young, Glenrothes, Scotland

[73] Assignee: Keneticon Limited, Glenrothes, Scotland

[21] Appl. No.: 764,971

[22] Filed: Aug. 12, 1985

[30] Foreign Application Priority Data

Oct. 6, 1984 [GB] United Kingdom ................ 8425299

[51] Int. Cl.⁴ .................... F24D 5/00; F24D 11/00
[52] U.S. Cl. ................... 219/392; 324/158 F; 324/73 PC; 219/521
[58] Field of Search ............... 219/209, 385, 386, 391, 219/392, 394, 402, 475, 521; 324/73 AT, 158 F, 73 PL; 342/242

[56] References Cited

U.S. PATENT DOCUMENTS

| | | | |
|---|---|---|---|
| 2,885,526 | 5/1959 | Paulding | 219/394 |
| 2,919,339 | 12/1959 | Hilliker | 219/386 |
| 2,944,134 | 7/1960 | Kenyon | 219/386 |
| 4,374,317 | 2/1983 | Bradshaw | 219/385 |

FOREIGN PATENT DOCUMENTS 525261 8/1939 United Kingdom .
603130 8/1948 United Kingdom .

Primary Examiner—E. A. Goldberg
Assistant Examiner—Lincoln Donovan
Attorney, Agent, or Firm—Mason, Fenwick & Lawrence

[57] ABSTRACT

A heating oven for use in ageing semiconductors comprises a heating chamber 5 for receiving a number of trays 10 of semiconductors. Each tray 10 can be passed into the heating chamber 5 and ejected from the heating chamber 5, without disturbing the temperature environment of the remaining trays 10 in the heating chamber 5. This is achieved by the provision of closeable openings 13 on the wall 11 of the heating chamber 5 through which trays 10 may be passed.

4 Claims, 7 Drawing Figures

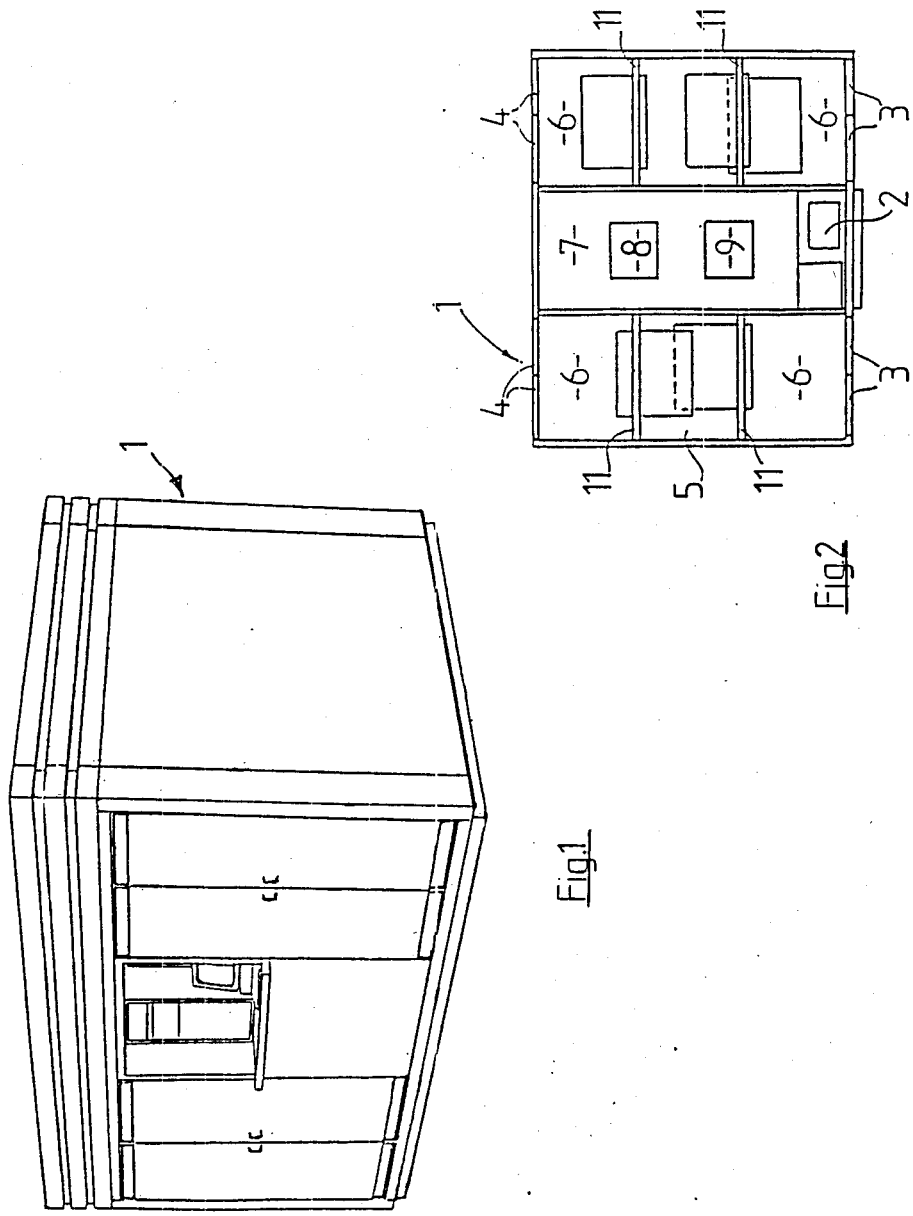

HEATING OVEN

BACKGROUND OF THE INVENTION

This invention relates to a heating oven, especially but not exclusively for use in ageing semiconductors.

Semiconductor devices such as silicon chip integrated circuits are prone to failure early in their lives, and it has previously been proposed to accelerate the natural ageing of the semiconductors by subjecting them to controlled heating before they are put in use. Such heating, or "burn-in" has the effect of exponentially accelerating the semiconductors through their life, so that their first year of life can be represented in, typically, 48 to 64 hours.

On testing the semiconductors after the ageing process, those which have failed can be picked out, leaving only the operational units. First-year failures in use can thus be greatly reduced.

Semiconductors have previously been aged in heating ovens into which trays of the semiconductors are place. As close temperature tolerances have to be observed, the heating cycle has to be completed before the oven door is opened and the units inspected. Thus all the units are heated simultaneously, and it can be difficult to isolate faulty units from operational ones during the process. Also, the process is a pure "batch" process which does not allow for sequential treatment of the units.

BRIEF SUMMARY OF THE INVENTION

According to the present invention there is provided a heating oven comprising a heating chamber for receiving a plurality of containers for items to be heated, the chamber wall being formed by a heat barrier which is openable at spaced intervals to allow passage therethrough of the individual containers in a manner whereby completion of each such passage causes that heat barrier to be reclosed.

Preferably the oven has a second chamber which is held at a different temperature from the heating chamber, and the chambers intercommunicate through the heat barrier. The second chamber is preferably at ambient room temperature.

The oven is especially of use in ageing semiconductors, in which case the containers are for example trays having electrical connections for a number of semiconductors. In use, therefore, each tray can be passed into the heating chamber for a preset time and automatically ejected from the heating chamber thereafter, without disturbing the temperature environment of the remaining trays in the heating chamber. This is achieved through the reclosing of the heat barrier on ejection of the tray.

A third chamber can also be provided on another side of the heating chamber from the second chamber, and of similar design to the second chamber. This third chamber can also intercommunicate with the heating chamber through the heat barrier, and trays of semiconductors may be movable between these chambers as between the heating chamber and the second chamber. The trays and their movement guides are then preferably arranged so that those movable into the second chamber interdigitate in the heating chamber with those movable into the third chamber; this allows easy inspection and handling of the trays in the second and third chambers while maximizing the number of trays receivable by the heating chamber. The trays when in each of the second and third chambers are spaced twice as far apart than when in the heating chamber.

The heat barrier may be formed in several ways, for example by means of flaps past which the containers can move and which return thereafter to their closed positions. Alternatively the heat barrier may be formed by providing a wall part of which is formed by portions of the containers when they are fully in, or fully out of, the heating chamber; thus each container can have a pair of faces spaced apart, each of which is engageable with the fixed portion of the wall when the container is appropriately positioned. Such engagement completes the heat barrier.

The fixed wall portion may be made up of bricks which interfit to provide apertures through which the containers can pass. The bricks may be removable for maintenance or replacement.

Preferably the containers are trays which slide on runners into and out of the heating chamber.

BRIEF DESCRIPTION OF THE SEVERAL VIEWS OF THE DRAWINGS

Embodiments of this invention will now be described by way of example with reference to the accompanying drawings, in which:

FIG. 1 is a perspective view of a heating oven of this invention;

FIG. 2 is a plan section through the oven of FIG. 1;

DETAILED DESCRIPTION

Figure 3:
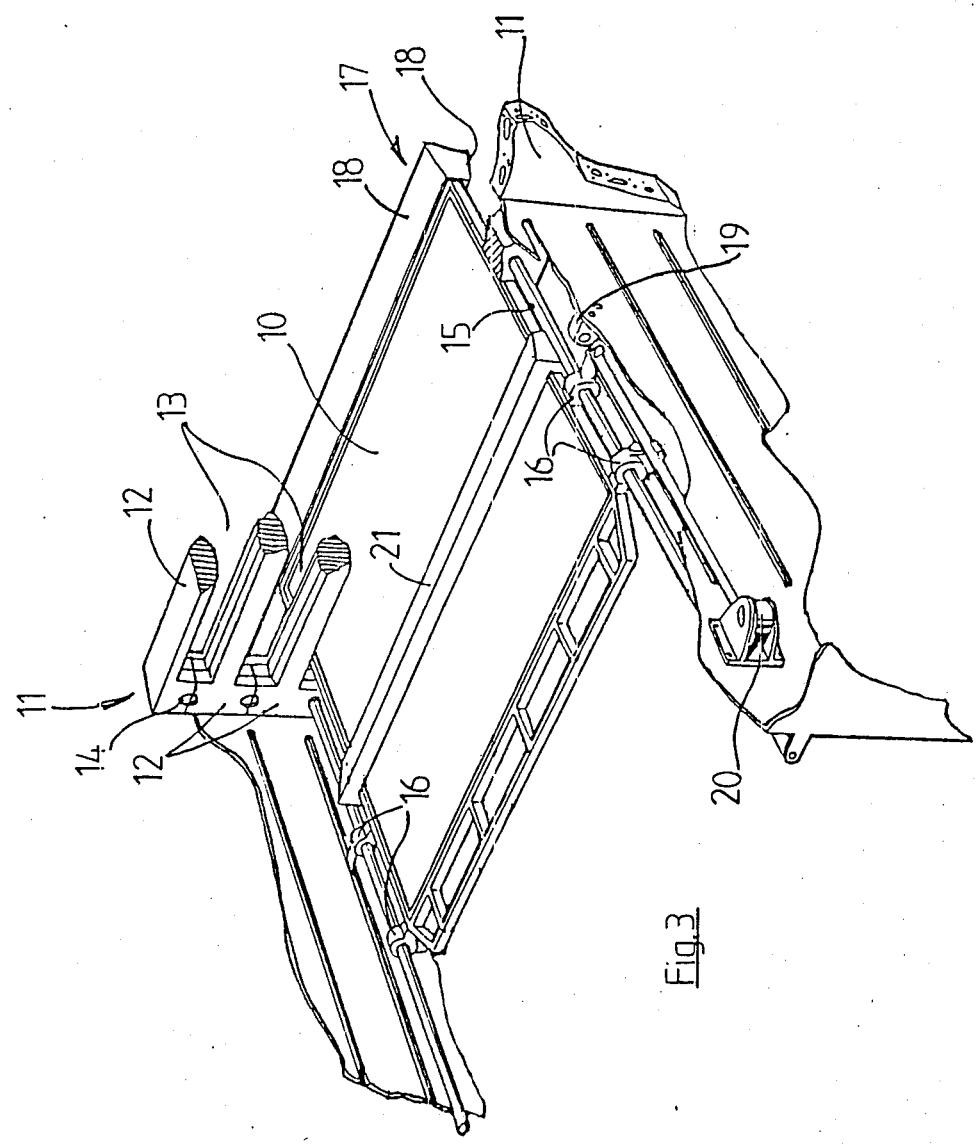
FIG. 3 is a cut-away perspective view of a first embodiment of a tray for receiving semiconductors and fitted within the oven of FIG. 1.

Referring to the drawings, a basic embodiment of an oven of this invention has an outer housing 1 having set into it a control and monitoring station 2 at which the condition and status of semiconductors being aged within the oven can be displayed. Glass doors 3 are provided at each side of the control station 2, and further doors 4 are provided in the opposite wall of the oven.

The interior of the oven is divided into heating chambers 5 and ambient temperature chambers 6, the ambient chambers 6 being disposed between the doors 3,4 and the heating chambers 5. A central area 7 within the oven houses heating and cooling units 8,9 from which extend pipes (not shown) which pass through the heating chambers 5. The heating and cooling of each chamber is independently controllable from the units 8,9 by means of the control station 2; such control may be thermostatically or otherwise effected, and can be assisted by the use of recirculating fans within the heating chambers 5 to ensure even distribution of heat therethrough.

The heating unit 8 is capable of producing within the chambers 5 temperatures of from 20° C. above ambient to 200° C., while the cooling unit 9 can provide temperatures as low as −55° C.

The walls of the heating chamber 5 are effectively insulated to provide a heat barrier, and trays 10 are mounted to slide on runners 15 (FIG. 3) through the walls 11 between the heating chambers 5 and ambient chambers 6. In each extreme position the trays 10 cooperate with the walls 11 to complete the heat barrier, as will be described below. The trays 10 each have electrical connectors fitted on them to receive semiconductors in the form of silicon chip integrated circuits; electricity is supplied through busbars from which highly flexible insulated copper braid extends to the trays 10, so as to allow unhindered travel of the trays 10.

The construction of the trays 10 and walls 11 is shown in FIG. 3. The walls 11 consist of interlocking oven bricks 12 stacked on one another, the bricks 12 being of a shape such that when interfitted they define elongate slots 13 between them. Each brick 12 has at either side portion a hole 14 through which guide runners 15 pass; sliding bearings 16 are mounted on these runners and carry the trays 10 between them.

At the rear of the tray 10 is an end strip 17 having faces 18 which taper inwardly and are engageable with the bricks 12 immediately above and below it. A further similar end strip 18 (not shown) is provided for fitment at the front of the tray 10, being removable or adjustable in position for easy access to the tray's contents.

A holding magnet 19 and a return spring 20 control the movement and position of the tray, being actuated from the control station 2.

The trays 10 in the ambient chambers 6 at opposite sides of the heating chamber 5 are mutually offset so that when they are slid on the runners 15 into the heating chamber 5 they interdigitate, thus allowing full use to be made of the height of the oven while permitting easy handling of the tray's contents in each ambient chamber 6.

The oven of this embodiment has eighty trays 10 and each tray has around three hundred silicon chip integrated circuits plugged into its connectors. The trays 10 are each independently controlled in movement from a mainframe computer through the control station 2, and thus any tray 10 can be loaded in the ambient chamber 6 while other trays 10 are inside the heating chamber 5. The engagement of the end strips 17 and 18 with the bricks 12 ensures that the heat barrier between the chambers 5 and 6 is effectively maintained whether the trays 10 are positioned within the heating chmaber 5 or ambient chamber 6.

A more detailed description of further embodiments of the system will now be made together with details on system operation and programming.

Figure 6:
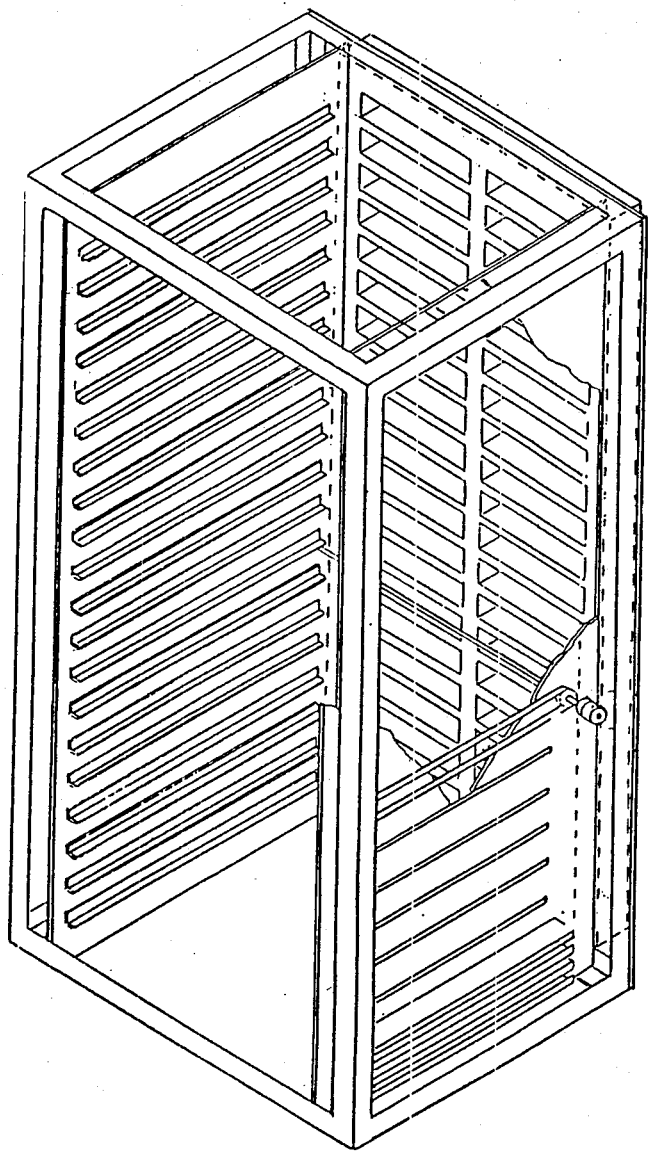
FIG. 6 is a part cut away perspective view of a stack module for the trays of FIG. 4.
Figure 7:
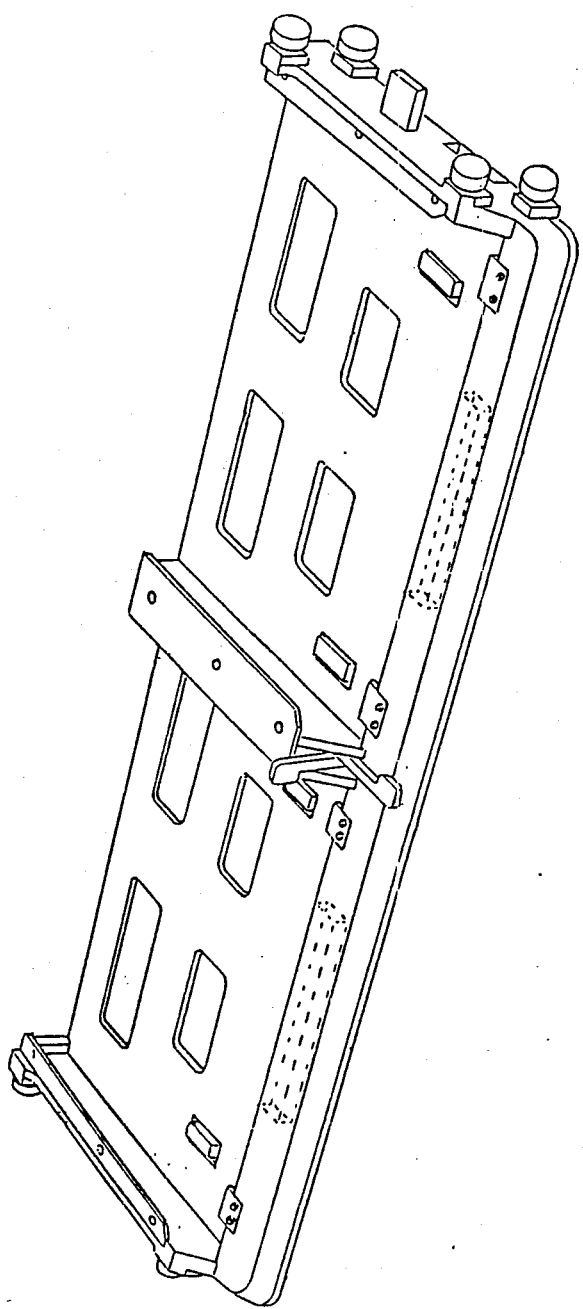
FIG. 7 is a perspective view of a carrier for the trays of FIG. 4.

A full-system Burn-in oven is partitioned into two elevated temperature chambers and two ambient temperature chambers. Capacity of each elevated temperature chamber is 80 liters and is fixtured to accommodate 160 device test module (DTM) trays, see FIG. 4, within the total system. The chamber is organised into 4 columns each containing 20 tray locations, see FIG. 6. At either side of the elevated temperature chambers is an ambient chamber accommodating the system power supply and distributed logic for the system. Each ambient chamber has sufficient capacity to accommodate all 40 or 80 DTM trays that are accessible form the respective sides of the elevated temperature chamber. Operator access to each ambient chamber is obtained through the glass doors at opposite sides of the system.

Each of the DTM trays penetrates through the high temperature chamber's insulated walls to allow the devices under test to be resident within the elevated temperature chamber whilst the control of the testing reamins within the ambient chamber.

Test System Manager apparatus (TSM) communicates with each Test Module Controller (TMC) to identify its status and the generic device type that it is currently programmed to test. If the device identity compares with the programmed information currently stored within the TMC's memory, then the TSM need only provide information relating to Labels, Batch Number, Time of Start, and Test Guidelines which are then formulated into a heading for a Test Report.

If the information contained within a TMC's memory does not match the devices about to be tested, then the TSM transfers the appropriate information from its Library which is contained on a Winchester Rigid Disc. The Heading information is then also appended as above.

Periodically during testing the TSM polls each of the TMCs and extracts the accrued test results from the TMCs memory thus allowing it to compute performance calculations for each tray whilst the testing continues. This makes it possible to determine the bottom of the failure rate "bathtub curve" of individual device batches and hence unnecessary burn-in time may be avoided.

Control of the evironmental temperature is remotely performed by the TSM which also monitors both the temperature and the elasped time within the systsem.

Cooling, and, as necessary, dehumidification of the environmental chamber is achieved by refrigeration techniques to allow controlled operation with high dissipation loads and also to allow below ambient temperatures to be attained.

In the event of overheating in the test chamber a control overide device switches on the refrigeration system and removes power from the Devices under Test. The Test System Manager is informed and an audible alarm sounds to alert the operator of the fault condition. All device trays are then automatically ejected from the elevated temperature.

The environment control is provided by a three term (proportional+integral+derivative) controller which is capable of communication to the test system manager via a RS-422 multi-drop bus structure.

Power supply modules are located in the Ambient Chamber and supply power to the Device Test Modules, the Test Module Controllers, and the distributed system logic.

Figure 4:
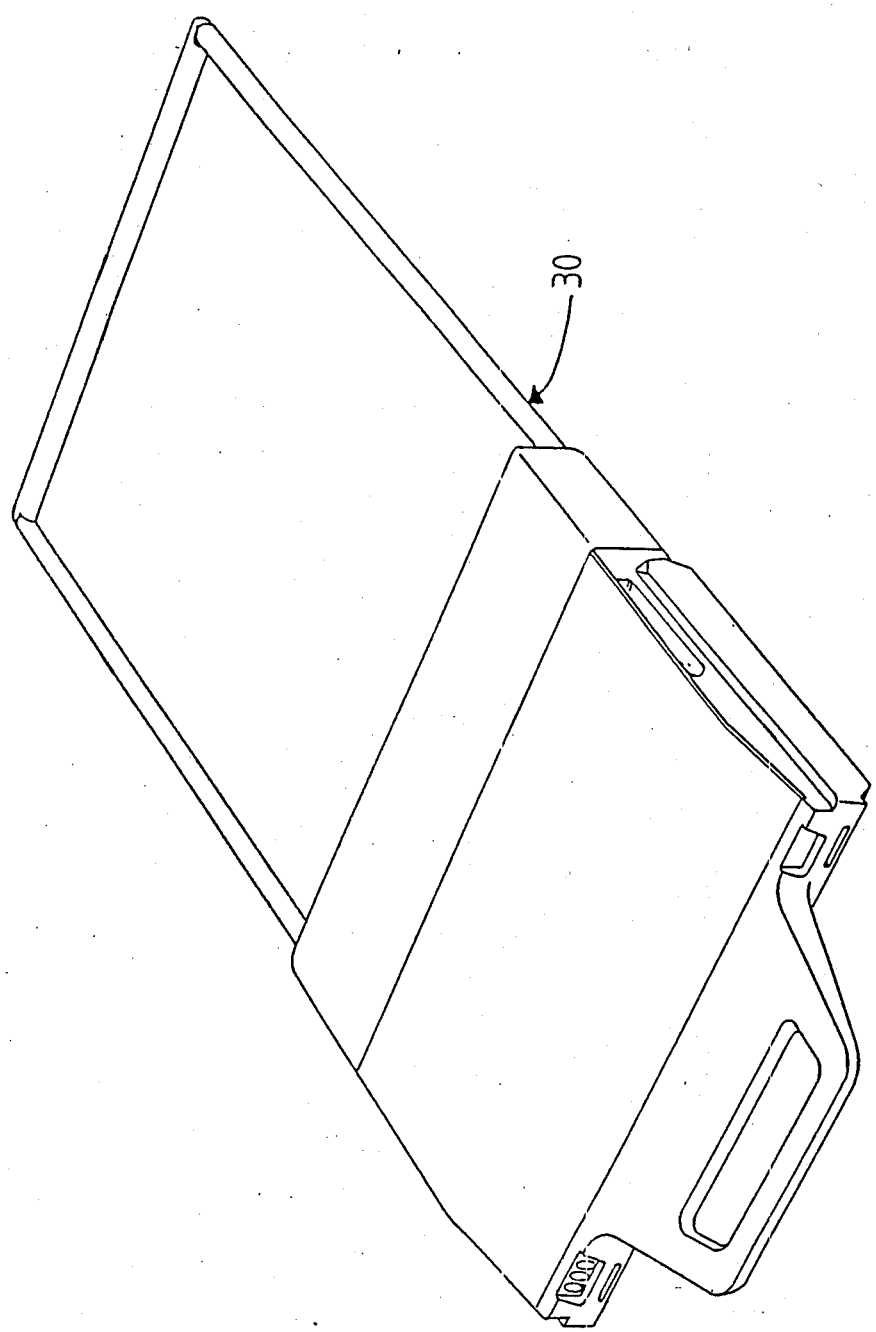
FIG. 4 is a perspective view of a second embodiment of a tray for receiving semiconductors.
Figure 5:
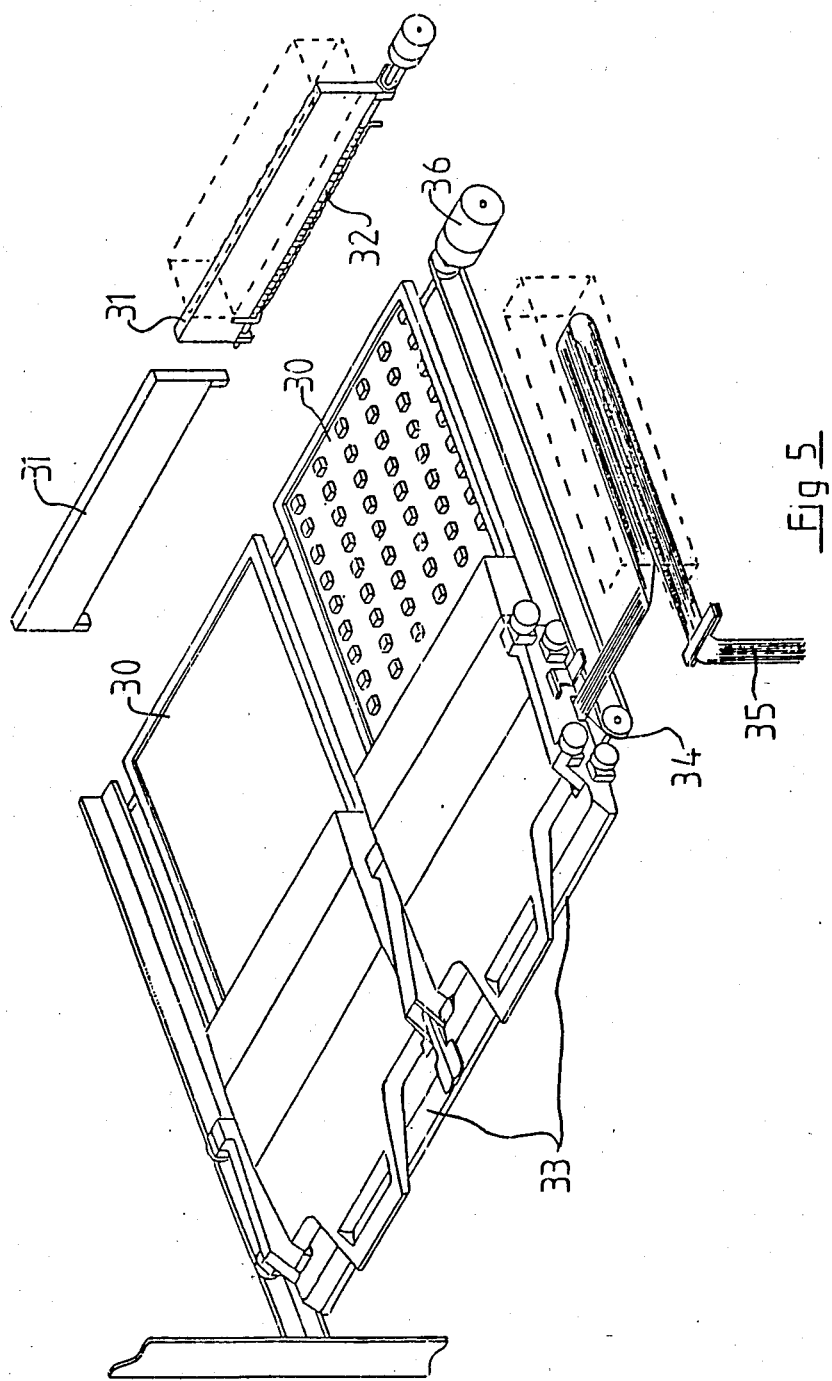
FIG. 5 is a perspective view of two of the trays of FIG. 4 mounted in a carrier.

Modified device tray 30 are shown in FIGS. 4 and 5. These trays 30 cooperate with hinged flaps 31 which extend across the slots 13 in the walls 11 of the heating chambers 5. The flaps 31 are hinged at their lower edges, and are provided with return springs 32. The flap 31 folds down when the tray 30 is inserted and closes autmotically under the influence of the spring 32 when the tray 30 is removed.

The trays 30 are mounted in carriers 33 and held in position by a combination of bayonet and latch type locks. A connector 36 is provided on each tray to allow the connection of a flexible cable 35 which moves in and out with the tray 30.

Each carrier 33 has its own drive motor 36 which is controlled by the central computer. The cable 35 supplies power so that each semiconductor being tested can have a voltage across it while in the heating chamber and, if desired, when out of the chamber.

The functional operation and control systems of the system will now be described in more detail.

The control system comprises Test System Manager apparatus at which an operator can command the system, and receive information. Manual controls, chart recorders and records and displays are configured ond the control station Console panel 2 to provide visual information and manual control.

Loading and unloading of the device boards is obtained through the glass doors 3 and 4, each giving access to forty carriages for burn-in boards. Upon opening the glass doors 3,4 the automatic ejection of any device tray currently in test within the stack of 20 is prevented to provide operator safety.

On system start-up, the operator is guided through a sequence of manual action, prompted by the console 2.

Referring now to FIG. 5, to start the burn-in cycle of one particular board, the operator opens the doors 3,4 and thereupon place either a single device board 30 or two device boards 30 onto a vacant carriage 33. The power and signals 35 are connected to the boards 30 via a Zero insertion force connector which makes electrical contacy by the activation of a small lever located at the front of the tray moulding.

The doors are then closed and the command to begin testing is entered via the system terminal. Power is then applied to the board and functional testing started once self-diagnostic and indentification procedures have been completed. Upon instruction from the TSM the board(s) mounted on the carriage are transported into the heated chamber automatically and the Burn-in processs commences.

The temperatures in each chamber is controlled by a Eyrotherm 820 temperature controller which is capable of switching contronl signals to heating and cooling in order to maintain the pre-set temperature. In addition the controller is connected via multidrop network to the test system manager. The TSM can inspect and set a range of 820 parameters. The 820 control panel can be used to set the setpoint but normally the TSM will disable it, and only the system manager can enabale it again by supplying the correct password to the 820, or directly setting parameters from the TSM using a diagnostic program.

When the system decides that burn-in for one particular board is finished, or when instructed by the operator to terminate burn-in for a particular board, the system locks the doors 3,4 and extracts the board from the burn-in enviornment back to the ambient temperature environment. While a board is cooling down, an indicator (LED) on the board is illuminated to indicate that the board has not completed cool-down. The operator can, however, load and unload other boards. When the cooling time has elapsed, the indicator goes out and a message to that effect is printed on the display.

In addition there is also a Eurotherm overtemperature policeman which is quite separate from the 820 controller. It is manually set by the operator and will override and disable the heating and cooling signal from the 820 until the policeman is manually reset.

When the TSM computer is started, the chamber status is reset to an 'inactive' state. No trays of burn-in boards can be started by the system in an inactive chamber. The operator or system manager is able to start up each or any chamber. There are two 'active' states: steady temperature, and cycling.

In steady temperature mode, the operator supplies a setpoint value in centigrade. The TSM ensures that this is within the chamber construction limits, and then, for each tray currently bruning-in in the specified chamber, examines the minimum and maximum device operating temperature specified in the device test and description file (DUT file). If the new requested setpoint is too high or too low for one or more boards an error message is printed. If desired the TSM may allow an override option to set the temperature regardless. Otherwise the user must enter a different setpoint within the range allowed by the current trays, or leave the current value unchanged. If the setpoint was changed, the TSM sends the new value to the 820 controller, and the controller operates autonomously to raise or lower the current temperature.

The temperature cycling option allows the user to specify the name of a file on a disk holding the required temperature profile. This reprograms the 820 setpoint at appropriate intervals without reference to the currently burning in trays.

When the operator requests that a chamber should be inactivated, the TSM takes control of the 820 controller (switching it into remote manual mode) and sets the heating and cooling off. Chamber fans continue to operate until manually switched off.

If the TSM fail to communicate with the 820 controllers after several retries, it sets the chamber status to 'inactive' for each 820 it cannot communicate with. In addition if the 820 status indicates a controller or thermometer failure the chamber is made 'inactive'.

When checking each active tray position, the TSM will force an abort on any active trays in an inactive chamber.

The operator controls the system via a C.R.T. monitor and keyboard. This is the operator's console 2 (FIG. 1). There is also a floppy disk drive to allow loading of device files and other software. The operator is able to enter commands and information at the keyboard in response to prompt and information messages displayed on the screen. The operator is also able to ask the system to display information on the screen or print it on an optional freestanding printer.

When the system is first started the operator is guided through a dialogue to supply necessary information, such as chamber temperature, etc.

The operator loads the device boards into the oven and uses the keyborad to instruct the system to perform inital checks on the load board and then start the burn-in-cycle.

The following table is a brief summary of the type of operator commands which are avialable.

| COMMAND | ACTION |
| --- | --- |
| START | Start burn-in for one device board. The operator is prompted for information such as board position, device name, batch identification code. |
| STOP | Prematurely terminate burn-in for one device board. The operator is prompted for the board position, and the system prints brief details and asks for confirmation. |
| PROGRESS | Print on the CRT screen or printer a brief progress report for any one device board. Lists items such as total burn-in time scheduled, elapsed time, failures so far. |
| REPORT | Generate a report for any one device board which has completed its burn-in. |
| SHUTDOWN | Shutdown the burn-in system. This forces premature termination of burn-in of remaining device boards and cooling of the oven unit. |
| HELP | Help facilities are provided to guide |

| COMMAND | ACTION |
|---------|--------|
|  | inexperienced operators, and explain prompt messages. |

A number of modifications and further embodiments have been envisaged. For example, a second operator console may be provided to allow two operators.

However, the same function would not be able to be requested simultaneously by both consoles e.g. loading boards, but one could load a board while the other requests status reports.

This could also use for an engineer to input or amend device file information, but this function would have a lower priority than the operator functions.

A third use would allow a serial connection to a freestanding microcomputer system which could be used to input device files. It would also be possible to write software to make the microcomputer emulate an operator console.

The fourth use would allow service personnel to run diagnostic tests while the system was running, and if suitably connected, remote systsem diagnosis could be carried out.

Further modifications and improvements may be made without departing from the scope of the invention.

I claim:

1. A heating oven for testing of semiconductors comprising:
   a heating chamber for receiving a plurality of containers, said containers having a first portion for receiving semiconductors to be tested and a second portion containing test control apparatus for said semicondutors;
   the chamber having a wall in the form of a heat barrier, said heat barrier defining apertures at spaced intervals to allow independent passage therethrough of each of said containers between a first position in which the portion for receiving semiconductors is fully out of the chamber and a second position in which the portion for receiving semiconductors is fully in the heating chamber;
   wherein a portion of each said container intermediate said first and second portions porvides a closure which forms a heat barrier for a corresponding aperture in the second position of said container.

2. A heating oven as claimed in Claim 1, wherein a further portion of each said container provides a closure which forms a heat barrier for a corresponding aperture in the first position of said container.

3. A heating oven as claimed in Claim 1, wherein each container is provided with drive means for moving said container between said first and second portions.

4. A heating oven as claimed in Claim 1, wherein electrical connections are provided to each of the containers independently, the electrical connections being maintained irrespective of the position of the containers.

* * * * *